United States Patent [19]

Pricer

[11] Patent Number: 5,767,747
[45] Date of Patent: Jun. 16, 1998

[54] ELECTRONIC LOW POWER CLOCK CIRCUIT AND METHOD

[75] Inventor: Wilbur David Pricer, Charlotte, Vt.

[73] Assignee: International Business Machines Corporation, Armonk, N.Y.

[21] Appl. No.: 704,318

[22] Filed: Sep. 12, 1996

Related U.S. Application Data

[63] Continuation-in-part of Ser. No. 516,852, Aug. 18, 1995, Pat. No. 5,673,005.

[51] Int. Cl.[6] .................................................. H03B 19/00
[52] U.S. Cl. ........................... 331/46; 331/47; 331/175; 331/111; 331/143; 327/291; 395/555; 368/202
[58] Field of Search ........................... 368/202, 168, 368/184, 170; 331/111, 113 R, 47, 175, 46, DIG. 3, 143, 144; 327/47, 48, 49, 291, 175; 968/822, 823; 377/47; 395/555

[56] References Cited

U.S. PATENT DOCUMENTS

| 4,110,701 | 8/1978 | Medwin ................. 331/1 A |
| 4,305,041 | 12/1981 | Frerking . |
| 4,513,259 | 4/1985 | Frerking ................. 331/176 |
| 5,416,435 | 5/1995 | Jokinen et al. ................. 327/113 |
| 5,673,005 | 9/1997 | Pricer ................. 331/1 R |

FOREIGN PATENT DOCUMENTS

| 57116287 A | 7/1982 | Japan . |
| 63281526 A | 5/1987 | Japan . |

OTHER PUBLICATIONS

Lanfranchi, D., et al., "A Microprocessor–Based Analog Wristwatch Chip with 3 Seconds/Year Accuracy", *IEEE: International Solid State Circuits Conference Digest of Technical Papers*, Feb. 1994, pp. 92–93.

Vittoz, E., "Low–Power Design: Ways to Approach the Limits", *IEEE: International Solid State Circuits Conference Digest of Technical Papers*, Feb. 1994, pp. 14–18.

*Primary Examiner*—Arnold Kinkead
*Attorney, Agent, or Firm*—Schmeiser, Olsen & Watts; Eugene I. Shkurko, Esq.

[57] ABSTRACT

A relatively low frequency oscillator in junction with a much higher frequency oscillator is used to produce a clock that is both accurate and minimizes power consumption. The high frequency oscillator is enabled only during a small portion of the clock's operation and is used to gauge the output of the low frequency oscillator. The output of the high frequency oscillator is counted during its operation period, and the amount counted is accumulated for subsequent time periods. When the accumulated count reaches a predetermined value, a clock output is provided.

22 Claims, 2 Drawing Sheets

ELECTRONIC LOW POWER CLOCK CIRCUIT AND METHOD

This application is a continuation-in-part of co-pending U.S. Pat. application Ser. No. 08/516,852, now U.S. Pat. No. 5,673,005, filed on Aug. 18, 1995 entitled "A Time Standard Circuit," which is incorporated herein by reference.

BACKGROUND OF THE INVENTION

1. Technical Field

This invention generally relates to electronic clock generators, and more specifically relates to high accuracy and low power consumption clock generators.

2. Background Art

Electronic clocks are used in a wide variety of applications. In many of these applications, the accuracy of the electronic clock is of paramount importance. Additionally, in many of these applications, such as in wristwatches and timing circuits for portable electronic devices, the power consumption of the electronic clock is also a critical parameter.

Many prior art electronic clock designs use crystal oscillators that rely on the velocity of sound through a piezoelectric crystal. Unfortunately, the cost of these precision ground crystals is excessive for some applications. The crystals also typically include their own separate package which adds unwanted space and cost for applications where space is a primary concern. Additionally, some of these prior art designs operate at high frequencies. Because power consumption is roughly proportional to the clock frequency, these prior art electronic clock designs have excessive power requirements that make them unsuitable for some applications.

Therefore there existed a need for a low power clock that overcomes the limitations of the prior art by providing an accurate clock signal with relatively low power consumption.

DISCLOSURE OF INVENTION

Summary

According to the present invention, a relatively low frequency oscillator in conjunction with a much higher frequency oscillator is used to produce a clock that is both accurate and minimizes power consumption. The high frequency oscillator is run only during a small portion of the clock's operation and is used to gauge the output of the low frequency oscillator. In particular, the output of the high frequency oscillator is counted during its operation period, and the amount counted is accumulated for subsequent time periods. When the accumulated count reaches a predetermined value, a clock output is provided. Thus, a highly accurate clock system that uses a minimum of power is provided.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

The preferred embodiment of the present invention provides an improved electronic clock that overcomes the limitations of the prior art by providing an accurate clock with low power consumption and without the costs of crystal oscillators. The preferred embodiment uses a relatively low frequency oscillator in conjunction with a much higher frequency oscillator to produce a clock that is highly accurate while minimizing power consumption. The high frequency oscillator is run only during a small portion of the clock's operation and is used to gauge the output of the low frequency oscillator. This operation is facilitated by the use of a high frequency oscillator with a fast turn on and off time. Thus, a highly accurate clock system that uses a minimum of power is provided.

Figure 1:
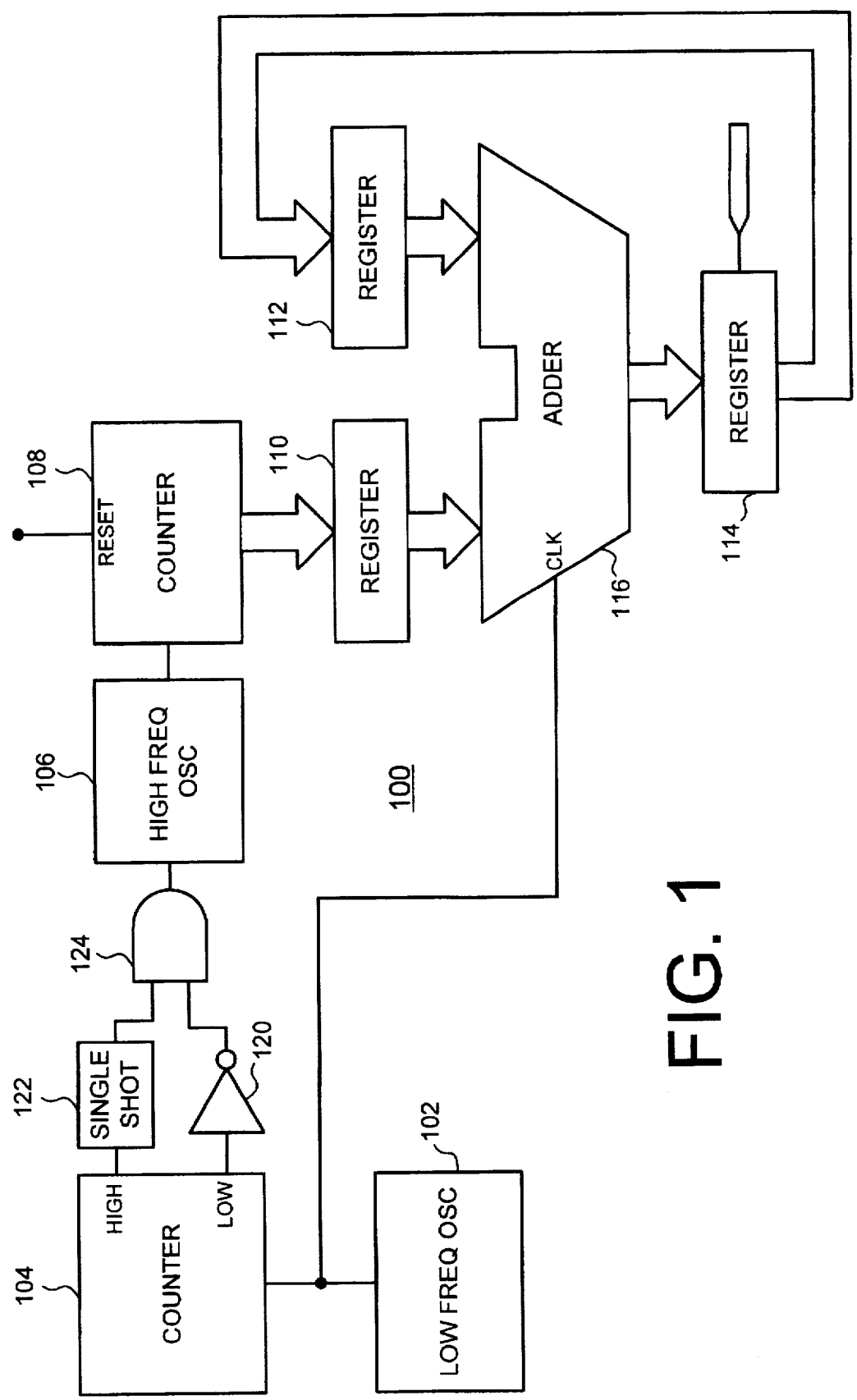
FIG. 1 is a schematic view of a low power clock 100 in accordance with the preferred embodiment of the present invention.

Turning now to FIG. 1, an electronic clock 100 in accordance with the preferred embodiment is illustrated. The electronic clock 100 comprises a low frequency oscillator 102; a first counter 104; a high frequency oscillator 106; a second counter 108; registers 110, 112 and 114; and an adder 116.

Several types of oscillators are suitable for use as low frequency oscillator 102. However, low frequency oscillator 102 is preferably an electronic oscillator that minimizes power consumption while providing a relatively stable output frequency. Low power consumption is important because the preferred embodiment low frequency oscillator 102 will operate continuously. As will become clear, the preferred feature of oscillator 102 is a output frequency that is at least short term stable while the accuracy of the output frequency is of lessor importance. In particular, low frequency oscillator 102 should have enough stability that it will not vary significantly between sampling times in normal operating conditions.

Figure 2:
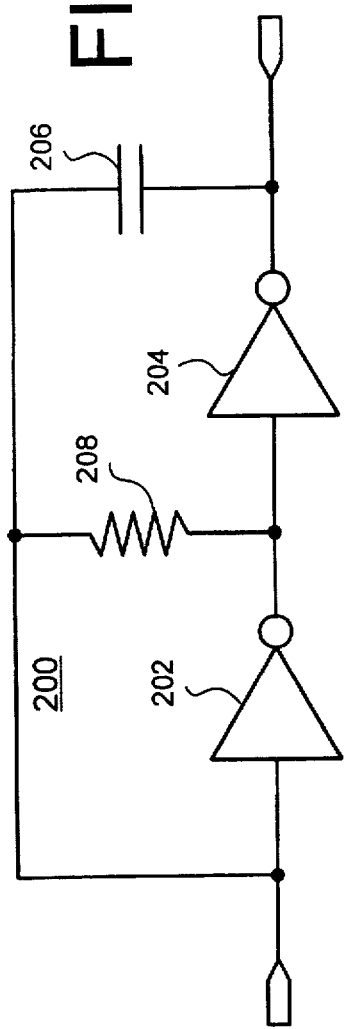
FIG. 2 is a schematic view of a multivibrator low frequency oscillator that is suitable for use as the low frequency oscillator of FIG. 1.

As an example, turning to FIG. 2, a common multivibrator circuit 200 is one type of low frequency oscillator that is suitable for use as low frequency oscillator 102. Multivibrator circuit 200 comprises a first inverter 202, a second invertor 204, a capacitor 206, and a resistor 208. The operational frequency of multivibrator circuit 200 is dependent almost entirely upon the resistance and capacitance values of the coupling network. For example, with a resistor 208 of 1M ohm and a capacitor 206 of 1000 picofarads, the output frequency would be approximately 500 Hz (making for a period of 2 milliseconds (ms)). At this relatively slow speed of oscillation, variations in the delays of inverters 202 and 204, which are in the sub-nanosecond range, become insignificant compared to the clock period (e.g., 2 ms) of the oscillator output. Because the operational frequency is not greatly dependent upon the delay through inverters 202 and 204, the frequency is relatively short term stable over a wide range of temperatures. In addition, the frequency can be further stabilized with the use of an on chip voltage regulator. Thus, multivibrator circuit 200 is short-term stable.

Additionally, because the low frequency oscillator is compactly integrated with high values of resistance and capacitance, low frequency oscillator 102 can be designed to consume less power than typical crystal based oscillators. Thus, multivibrator circuit 200 is also a relatively low power oscillator.

These characteristics make the multivibrator circuit 200 suitable for use as the low frequency oscillator 102 of FIG. 1. While multivibrator circuit 200 exhibits good stability, (i.e., the frequency is short term stable over variations in operating characteristics), it is however, not very accurate (i.e., the oscillation is not exactly at a predetermined frequency). As will become clear however, the accuracy of the electronic clock 100 of FIG. 1 is not dependent upon the accuracy of the low frequency oscillator 102, and therefore this limitation is acceptable. Of course, other suitable oscillators can be used as low frequency oscillator 102 that have suitable stability and low power consumption.

Returning to FIG. 1, the output of low frequency oscillator 102 is connected to the input of counter 104. Counter 104 can be any suitable digital counter with sufficient bits to achieve the desired timing characteristics at its outputs.

The low order bit output of counter 104 inputs to an inverter 120 while a high order bit output of counter 104 inputs to a single shot 122. In the preferred embodiment, the low order bit is a least significant bit. The inverter 120 and single shot 122 each input to an AND gate 124. The low frequency oscillator 102 drives counter 104. With the low frequency oscillator 102 driving counter 104, and the least significant bit used as the low order bit, the output of counter 104 performs a divide-by-two operation and will thus comprise a series of pulses with a frequency of one half the low frequency oscillator 102 output, and without any of the possible asymmetry associated with low frequency oscillators. Thus, the low bit output of counter 104 is a stream of pulses each having a width equal to one period of the low frequency oscillator 102 output. Other bits can be used as a low order bit, and the resulting output has a proportionally lower frequency. This low bit output of counter 104 is tied to the input of inverter 120.

A high bit output of counter 104 is tied to single shot 122. The particular high bit of counter 104 connected to single shot 122 will depend upon how long the high frequency oscillator 106 is to be turned on, which defines the operational ratio of high frequency oscillator. Every time the high bit output goes high single shot 122 outputs a pulse. When both the single shot 122 output pulse and the inverter 120 output are high, the output of AND gate 124 will be high as well. Thus, the output of AND gate 124 will comprise a stream of pulses, with a pulse occurring once every time the selected high bit goes high and having a width equal to one period of low frequency oscillator 102. This stream of pulses will be used to activate high frequency oscillator 106, with high frequency oscillator 106 being on when the pulse is high.

Thus, by selecting an appropriate high bit output from counter 104, the on/off ratio of high frequency oscillator 106 operation can be determined. For example, when this invention is used in an electronic wrist watch, the ratio is preferably selected to have the high frequency oscillator 106 operate for one period of the low frequency oscillator every ten seconds.

The single shot output pulse is preferably long enough that AND gate 124 output captures the entire cycle of the low order bit output but not long enough that it might capture part of a second cycle. Therefore, the preferred range of delay for single shot 122 is between one and two times the period of low frequency oscillator 102. Furthermore, single shot 122, inverter 120 and AND gate 126 serve to clean up the clock edges to eliminate errors by eliminating asymmetry that may exist in the low frequency oscillator 102 output.

The output of the AND gate is delivered to the control input of high frequency oscillator 106. With this being the case, high frequency oscillator 106 will operate only when a pulse from AND gate 124 is high at the high frequency oscillator 106 input.

High frequency oscillator 106 is preferably an oscillator capable of providing a high frequency, high accuracy oscillator. Furthermore, the high frequency oscillator 106 is preferably capable of quickly turning on and establishing a stable output. It is also preferably capable of turning off quickly, as described in more detail below.

Figure 3:
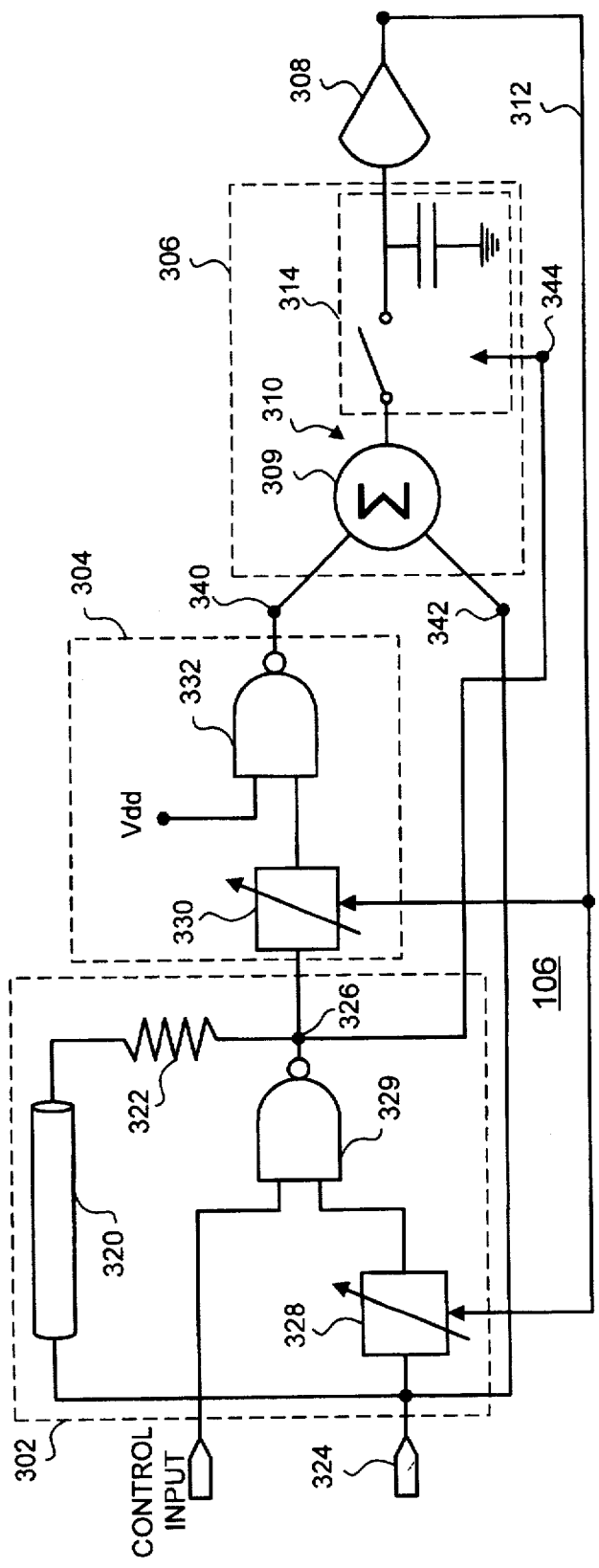
FIG. 3 is a is a schematic view of a high frequency oscillator that is suitable for use as the high frequency oscillator of FIG. 1.

Turning to FIG. 3, FIG. 3 is a schematic illustration of a suitable high frequency oscillator 106 in accordance with the preferred embodiment of the present invention. High frequency oscillator 106 is a high accuracy digital oscillator with quick turn on and off response time. As such, high frequency oscillator 106 is suitable for use in the electronic clock 100 of FIG. 1. However, other suitable high frequency oscillators with quick turn on/turn off times and of high accuracy could also be used.

High frequency oscillator 106 essentially comprises an oscillator circuit 302 coupled through a variable delay inverter circuit 304 to a comparator circuit 306 and amplifier 308. Oscillator circuit 302 comprises a delay line 320 coupled in series with an impedance 322 between oscillator port 324 and oscillator 302 output 326. A variable delay element 328, coupled to an input of NAND gate 329, is arranged in parallel with delay line 320 and impedance 322, between oscillator port 324 and oscillator output 326. The second input to NAND gate 329 is tied to the control input. Thus, when the control input goes high, the output of NAND gate 329 initially goes low and the oscillator circuit 302 proceeds to oscillate.

In particular, when the control input goes high, the NAND gate 329 function reduces to a simple inverter. The circuit can thus be characterized as an inverter with its output connected to its input via a suitable phase delay (provided by delay line 320 and variable delay element 328). A transient appearing at the input of NAND gate 329 will be inverted at the output, and will appear back at the input of NAND gate 329 after a delay equal to the delay through delay line 320 and variable delay element 328, and becomes a new transient in the opposite direction. Thus, each transient after a suitable delay stimulates another transient in the opposite direction and hence the circuit oscillates.

Conversely, when the control input is low, oscillator circuit 302 does not oscillate. This allows high frequency oscillator 106 to be operated only when necessary, allowing for efficient power usage in accordance with the preferred embodiment.

The output frequency of high frequency oscillator 106 at port 324 is dependent almost entirely on the amount of delay caused by delay element 320. The oscillator circuit output 326 is coupled to the input of variable delay circuit 304. Variable delay circuit 304 comprises a variable delay element 330 connected to one output put of a NAND gate 332. The second input of NAND gate 332 is connected to the positive power supply voltage, and as such NAND gate 332 operates as an inverter. The output of variable delay circuit 304 is connected to the first input 340 of the comparator circuit 306. The second input 342 of comparator circuit 306 is connected to oscillator port 324. The third input 344 of comparator circuit 306 is connected to the oscillator output 326. The comparator circuit 306 output is connected to the amplifier 308 input.

Comparator circuit 306 comprises a summation circuit 309 and a sample and hold circuit 310. Summation circuit 310 senses the difference in phase between the signal arriving from first input 340 and the signal arriving from second input 342. The difference between these signals is outputted from the summation circuit 310 in the form of an error signal and filtered through sample and hold circuit 314. The sample time for the sample and hold circuit 314 is determined by a signal at input 344. In the preferred embodiment, the output of oscillator 302 is connected to input 344 and used to control sample time.

Amplifier 308 is preferably a high gain, frequency compensated amplifier. Amplifier 308 is selected to generate a sufficiently large error signal to correct for most of the delays within a single cycle and to prevent any significant short term frequency instability but should not be so large as to create instabilities in the feedback loop.

Thus, comparator circuit 306 and amplifier 308 provide an error signal which is coupled through a feedback loop 312 to variable delay invertor 304 and oscillator 302. The error signal is fed back via feedback line 312 to variable delay elements 328 and 330. This error signal is used to control the delay through variable delay elements 328 and 330, and provides negative feedback to allow oscillator 106 to maintain a highly accurate frequency at its output. Any of the following nodes may be used as the output of oscillator 106; 324, 326, 326, 340 and 342.

Summation circuit 306, amplifier 308 provide an amplified error signal on feedback line 312 that operates on variable delay elements 328 and 330 to adjust their delays such that the error signal is minimized. The error signal is minimized (i.e., equal to zero) when the delay through precision delay line 320 equals the delay through variable delay element 328 and its associated NAND gate 329. The amplified error signal thus adjusts the variable delay element 328 until the delay through variable delay element 328 and NAND gate 329 equals the delay through precision delay line 320. Because it is adjusted by the same amplified error signal, variable delay element 330 is also adjusted until the delay through variable delay element 330 and its associated NAND gate 332 is also equal to the delay through precision delay line 320. Thus, as the error signal becomes convergent on zero error, the oscillating frequency becomes almost solely dependent on the delay through precision delay line 320.

Precision delay line 320 is preferably fabricated as a simple transmission line within the integrated circuit using one level of metal as the signal path and either one or two other levels as the ground plane. The signal path is separated from the ground plane by a dielectric layer which has a known and very stable dielectric constant. The length of this signal path is controlled by standard photolithographic techniques used in integrated circuit fabrication. These photolithographic techniques are, of great necessity, renown for their precision.

Thus, high frequency oscillator 106 provides an oscillator with exceptional accuracy. Additionally, the high frequency oscillator can be turned on and off by application of a signal to the control input. When the control input is high, the high frequency oscillator 106 runs; when it is low, the control input turns oscillator 106 off. Thus, the high frequency oscillator can be operated only when necessary, avoiding the excessive use of power.

High frequency oscillator 106 is an on-chip precision oscillator with an operational frequency that is almost entirely dependent upon the velocity of light down a photolighgraphically determined length of electrical delay line. The high frequency oscillator 106 thus provides a high accuracy, high frequency oscillator that quickly reaches operational frequency when switched on.

Returning to FIG. 1, the output of high frequency oscillator 106 is tied to the input of counter 108. With high frequency oscillator 106 operating during one period of the low frequency oscillator 102 output, counter 108 counts the number of pulses that are outputted from high frequency oscillator 106 during this time period. Because high frequency oscillator 106 is preferably a very accurate oscillator, the number "counted" will be accurately proportional to the actual time elapsed. The count is captured within a quantifying accuracy equal to the ratio of the output frequencies of low frequency oscillator 102 and high frequency oscillator 106. Using the exemplary numbers for an electronic wrist watch, the two oscillators differ so greatly in frequency (500 Hz and 500 MHz), the count can be captured within a quantifying accuracy of 1/1,000,000.

As soon as the count is completed for a period, the number of cycles counted is outputted and stored in register 110. Registers 110, 112, 114, and adder 116 comprise an accumulator. As such, register 110 outputs the number of cycles counted to adder 116. The adder 116 is controlled by a clock signal coming from the low frequency oscillator 102. As such, the adder 116 will add the number of cycles counted and stored in register 110 for each clock cycle of the low frequency oscillator 102. During these operations the registers 110, 112 and 114 do not need to be reset.

Thus, adder 116 will add the output of register 110 to the previous value of the accumulator (as stored on register 112) for each clock cycle of the low frequency oscillator. Because they are counting the accurate pulses of high frequency oscillator 106, the number counted will be directly proportional to the actual time elapsed. Thus, the output of output register 114 is monitored until the count indicates that the required time has elapsed. For example, if the low power clock 100 is to be used as a watch, the output of register 114 is monitored until the output is activated to signal that the register 114 counted the number of high frequency pulses that correspond to one second elapsing.

Thus, the low power oscillator is calibrated to have the accuracy of the high frequency oscillator 106 but because the high frequency oscillator 106 is operated only a small portion of the time, there is a significant reduction in the power used. In effect, the operation achieves the benefits of high frequency oscillator 106 accuracy running the high frequency oscillator 106 for one period of the low frequency oscillator 102 and then adding the number of cycles for each of the remaining low frequency oscillator 102 periods.

The accurate high frequency oscillator 106 is run for one period of the low frequency oscillator. The high frequency oscillator pulses are counted during this time, and that amount is added to an accumulator for every clock cycle of low frequency oscillator 102. Thus, the accumulator stores the amount that would have been there had high frequency oscillator 106 been running all along. The number of pulses counted by counter 108 is in a sense used to calibrate the low frequency oscillator output. As long as low frequency oscillator 102 is short term stable (i.e., the output frequency does not vary significantly before the next time high frequency oscillator 106 operates and its output is counted), the resulting clock signal is extremely accurate.

Counter 108 is preferably reset right before it gets another stream of pulses from high frequency oscillator 106. This can be facilitated in a variety of ways, such as another circuit network much like 120, 122, and 124. Conversely, the counter 104 does not need to be reset to operate properly. The register 114 is preferably not reset. As such, any overflow occurring when register 114 reaches its predetermined value will be accounted for in the next cycle, and will eventually be averaged out.

While the invention has been particularly shown and described with reference to a preferred exemplary embodiment thereof, it will be understood by those skilled in the art that various changes in form and details may be made therein without departing from the spirit and scope of the invention. It will be also understood that, while various of the conductors are shown in the drawing as single lines, they are not so shown in a limiting sense, and may comprise plural conductor, as is understood in the art.

I claim:

1. An electronic clock circuit comprising:
   a) a first oscillator, said first oscillator outputting a first signal having a first frequency and a first period;
   b) a second oscillator, said second oscillator outputting a second signal having a second frequency, said second oscillator being activated for a first time portion at predetermined time intervals, wherein said first time portion is determined by said first signal;
   c) a counter mechanism, said counter mechanism counting pulses of said second signal during said first time portion;
   d) an accumulation mechanism, said accumulation mechanism having a input coupled to the output of said counter mechanism, said accumulation mechanism adding a value equal to the output of said counter mechanism to a previously accumulated total for subsequent time portions equal to said first time portion, wherein said accumulation mechanism outputs a signal when the accumulated total of said accumulation mechanism exceeds a predetermined value.

2. The electronic clock circuit of claim 1 wherein said first oscillator comprises a multivibrator circuit.

3. The electronic clock circuit of claim 1 further comprising a second counter mechanism, said second counter mechanism receiving said first signal and controlling the activation of said second oscillator.

4. The electronic clock circuit of claim 3 further comprising a logic mechanism, said logic mechanism receiving at least two different bit outputs from said second counter mechanism and outputting an oscillator control signal, said oscillator control signal comprising a pulse having pulse width approximately equal to said first period.

5. The electronic clock circuit of claim 1 wherein said second frequency is greater than about 500 MHz.

6. The electronic clock circuit of claim 1 wherein said accumulator mechanism receives said first signal, said first signal determining when said accumulator mechanism adds said value equal to the output of said counter mechanism.

7. The electronic clock circuit of claim 1 wherein said second oscillator comprises:
   a) a comparing mechanism having first and second inputs and an output;
   b) an oscillator circuit, said oscillator circuit including a delay line coupled with a first logic gate and a first variable delay element, said first logic gate and said first variable delay element cooperating to hold the frequency of said oscillator circuit constant, the output of said oscillator circuit coupled to said first input of said comparing mechanism;
   c) a delay inverter circuit, said delay inverter circuit including a second variable delay element coupled to a second logic gate, said delay inverter circuit being coupled in common with said oscillator circuit and further coupled to said second input of said comparing mechanism;
   d) said comparing mechanism sensing the phase difference between the output signal of said delay inverter circuit and the output signal of said oscillator circuit and providing an error signal, said error signal providing feedback to said first and second variable delay elements.

8. The electronic clock circuit of claim 7 wherein said comparing mechanism comprises a summation circuit.

9. The electronic clock circuit of claim 8 wherein said comparing mechanism further comprises a sample and hold circuit.

10. The electronic clock circuit of claim 7 wherein said first logic gate comprises a NAND gate and wherein one input of said NAND gate receives an oscillator control signal input.

11. The electronic clock circuit of claim 7 wherein said accumulation mechanism comprises a first register, a second register, a third register and an adder, wherein said first register receives said output of said counter mechanism and wherein said second register stores said accumulated total and said third register outputs when said third register reaches said predetermined value.

12. An electronic clock circuit comprising:
   a) a low frequency oscillator, said low frequency oscillator outputting a first signal having a first frequency and a first period;
   b) a low frequency oscillator counter mechanism, said low frequency oscillator counter mechanism receiving said first signal, and outputting a low bit output and a high bit output;
   c) a logic mechanism, said logic mechanism receiving said low bit output and said high bit output and outputting a high frequency oscillator control signal, said high frequency oscillator control signal comprising a pulse having a pulse width proportional to said first period;
   b) a high frequency oscillator, said high frequency oscillator receiving said high frequency oscillator control signal, said high frequency oscillator outputting a high frequency signal during said high frequency oscillator control signal;
   c) a high frequency oscillator counter mechanism, said high frequency oscillator counter mechanism counting pulses of said high frequency signal; and
   d) an accumulation mechanism, said accumulation mechanism having as an input the output of said high frequency oscillator counter mechanism, said accumulation mechanism adding a value equal to the output of said high frequency-oscillator counter mechanism to a previously accumulated total for each subsequent time period approximately equal to said pulse width of said high frequency oscillator control signal, said accumulation mechanism outputting a signal when said accumulated total of said accumulation mechanism exceeds a predetermined value.

13. The electronic clock circuit of claim 12 wherein said first frequency is less than about 1 MHz.

14. The electronic clock circuit of claim 12 wherein said high frequency signal has a frequency greater than about 500 MHz.

15. The electronic clock circuit of claim 12 wherein said logic mechanism comprises a single shot circuit connected to said high bit output and an inverter connected to said low bit output.

16. The electronic clock circuit of claim 12 wherein said low frequency oscillator comprises a multivibrator circuit.

17. The electronic clock circuit of claim 12 wherein said high frequency oscillator comprises:
   a) a comparing mechanism having first and second inputs and an output;
   b) an oscillator circuit, said oscillator circuit including a delay line coupled in parallel with a first logic gate and a first variable delay element, said first logic gate and said first variable delay element cooperating to hold the frequency of said oscillator circuit constant, the output of said oscillator circuit coupled to said first input of said comparing mechanism;
   c) a delay inverter circuit, said delay inverter circuit including a second variable delay element coupled to a second logic gate, said delay inverter circuit being coupled in common with said oscillator circuit and further coupled to said second input of said comparing mechanism; and
   d) said comparing mechanism sensing the phase difference between the output signal of said delay inverter circuit and the output signal of said oscillator circuit and providing an error signal, said error signal providing feedback to said first and second variable delay elements.

18. The electronic clock circuit of claim 17 wherein said comparing mechanism comprises a summation circuit and a sample and hold circuit.

19. The electronic clock circuit of claim 17 wherein said first logic gate comprises a NAND gate and wherein one input of said NAND gate receives an oscillator control signal input.

20. A method for generating a clock signal, the method comprising the steps of:
   a) providing a first oscillating signal, said first oscillating signal having a first frequency and a first period;
   b) providing a second oscillating signal for a first portion of time, wherein said first portion of time is approximately equal to said first period, said second oscillating signal comprising a number of pulses;
   c) counting said number of pulses comprising said second oscillating signal during said first portion of time;
   d) accumulating said number of pulses for each subsequent portion of time equal to said first portion of time;
   e) outputting a clock signal when said accumulated number of pulses reaches a predetermined value.

21. The method of claim 20 further comprising the step of resetting said count of said number of pulses before said step of providing a second oscillating signal during said portion of time.

22. The method of claim 20 wherein said second frequency and said first frequency have a ratio proportional to accuracy of said clock signal.

* * * * *

UNITED STATES PATENT AND TRADEMARK OFFICE
CERTIFICATE OF CORRECTION

PATENT NO. : 5,767,747
DATED : June 16, 1998
INVENTOR(S) : Wilbur David Pricer

It is certified that error appears in the above-identified patent and that said Letters Patent is hereby corrected as shown below:

In column 7, at line 37, the text "first signal and controlling" should read --first signal output and controlling--.

Signed and Sealed this

First Day of September, 1998

*Attest:*

*Attesting Officer*

BRUCE LEHMAN

*Commissioner of Patents and Trademarks*